(12) United States Patent
Gerlach et al.

(10) Patent No.: US 8,837,647 B2
(45) Date of Patent: Sep. 16, 2014

(54) ANTENNA AMPLIFIER, RECEIVING SYSTEM, OPERATING METHOD, AND USE OF A RECEIVING SYSTEM

(75) Inventors: Stephan Gerlach, Flein (DE); Leo Friesen, Neckarsulm (DE); Carsten Friedrich, Asperg (DE); Michael Amann, Murr (DE); Carsten Huber, Gemmrigheim (DE)

(73) Assignee: Atmel Corporation, San Jose, CA (US)

( * ) Notice: Subject to any disclaimer, the term of this patent is extended or adjusted under 35 U.S.C. 154(b) by 728 days.

(21) Appl. No.: 12/567,349

(22) Filed: Sep. 25, 2009

(65) Prior Publication Data

US 2010/0074370 A1 Mar. 25, 2010

Related U.S. Application Data

(60) Provisional application No. 61/100,166, filed on Sep. 25, 2008.

(30) Foreign Application Priority Data

Sep. 25, 2008 (DE) .......................... 10 2008 048 986

(51) Int. Cl.
*H04L 27/08* (2006.01)
*H04L 25/08* (2006.01)
*H03G 3/30* (2006.01)
*H04B 1/18* (2006.01)

(52) U.S. Cl.
CPC ............... *H04B 1/18* (2013.01); *H03G 3/3052* (2013.01)
USPC ............................ 375/345; 375/344; 375/316

(58) Field of Classification Search
USPC ......... 375/316, 211, 219, 220, 222, 285, 304, 375/306, 307, 310, 311, 312, 295, 318, 344, 375/345, 346, 358, 317, 324, 340, 354, 362
See application file for complete search history.

(56) References Cited

U.S. PATENT DOCUMENTS 4,032,853 A * 6/1977 Hibbs, Jr. .......................... 330/2
7,088,794 B2 * 8/2006 Nichols .......................... 375/345

(Continued)

FOREIGN PATENT DOCUMENTS

DE 103 52 290 A1 6/2005
EP 1 035 659 A1 3/2000

(Continued)

OTHER PUBLICATIONS

Text of First Office Action dated Jul. 13, 2012, but no reported until Sep. 29, 2012, Chinese Patent Application No. 2009/10246803.4 (with translation).

*Primary Examiner* — Sam K Ahn
*Assistant Examiner* — Linda Wong
(74) *Attorney, Agent, or Firm* — Baker Botts LLP

(57) ABSTRACT

An antenna amplifier, receiving system, operating method, and use of a receiving system, is provided. The antenna amplifier includes a first signal input and a second signal input for connecting antennas, a first amplifier circuit connected to the first signal input and having a first digital control signal input for receiving a first digital control signal for setting an amplification of the first amplifier circuit and a first signal output, a second amplifier circuit connected to the second signal input and having a second digital control signal input for receiving a second digital control signal for setting an amplification of the second amplifier circuit and a second signal output, a summator connected to the first signal output and the second signal output for outputting a sum signal to a sum signal output, and a digital gain controller with a digital command signal input for receiving a digital command signal and a digital control signal output for outputting the first digital control signal and the second digital control signal.

18 Claims, 3 Drawing Sheets

(56) References Cited

U.S. PATENT DOCUMENTS

| | | |
|---|---|---|
| 7,324,794 B2 * | 1/2008 | Chari et al. ............... 455/130 |
| 2004/0264554 A1 * | 12/2004 | Harms et al. .............. 375/147 |
| 2007/0120721 A1 * | 5/2007 | Caduff et al. ............. 341/155 |
| 2007/0222524 A1 | 9/2007 | Kottschlag et al. |
| 2011/0075861 A1 * | 3/2011 | Wu et al. .................. 381/107 |

FOREIGN PATENT DOCUMENTS

| | | |
|---|---|---|
| GB | 2 251 360 A | 7/1992 |
| JP | 2007-81975 A | 3/2007 |
| WO | WO 2008026176 A2 * | 3/2008 |

* cited by examiner

US 8,837,647 B2

ANTENNA AMPLIFIER, RECEIVING SYSTEM, OPERATING METHOD, AND USE OF A RECEIVING SYSTEM

This nonprovisional application claims priority to German Patent Application No. 10 2008 048 986.7, which was filed in Germany on Sep. 25, 2008, and to U.S. Provisional Application No. 61/100,166, which was filed on Sep. 25, 2008, and which are both herein incorporated by reference.

BACKGROUND OF THE INVENTION

1. Field of the Invention

The present invention relates to an antenna amplifier, a receiving system, an operating method, and use of a receiving system in a motor vehicle.

2. Description of the Background Art

European Pat. Appl. No. EP 1035659 A1 discloses a radio receiver with a multi-antenna stage and a receiver stage, whereby the receiver stage has a switching unit for switching between receiving of frequency-modulated radio waves (FM operation) and amplitude-modulated radio waves (AM operation), as well as at least one intermediate frequency amplifier. An input of the receiver stage and an output of the intermediate frequency amplifier are connected at least indirectly via a connecting line with the multi-antenna stage for receiving of radio signals from the multi-antenna stage or for transmitting of amplified intermediate frequency signals to the multi-antenna stage.

The multi-antenna stage has an evaluation circuit for selecting a receive antenna as a function of signals transmitted from the receiver stage. The radio receiver has a decoupling unit between the output of the intermediate frequency amplifier and the connecting line, whose decoupling effect can be activated (decoupling stage) or deactivated (transmission stage) by switching between the AM operation and FM operation, or vice versa.

SUMMARY OF THE INVENTION

It is therefore an object of the present invention to improve an antenna amplifier in a motor vehicle as much as possible. Accordingly, an antenna amplifier is provided which is suitable for amplifying antenna signals. The antenna amplifier can be integrated monolithically on a semiconductor chip.

The antenna amplifier can have a first signal input and a second signal input for connecting antennas. In addition, one or more additional signal inputs can be provided for connecting more than two antennas. The inputs are formed, for example, as a pad structure.

The antenna amplifier can have a first amplifier circuit, connected to the first signal input and can have a first digital control signal input for receiving a first digital control signal. The first amplifier circuit is formed to set an amplification of the first amplifier circuit by means of the first digital control signal. The first amplifier circuit, in addition, has a first signal output.

The antenna amplifier can have a second amplifier circuit, connected to the second signal input and can have a second digital control signal input for receiving a second digital control signal. The second amplifier circuit is formed to set an amplification of the second amplifier circuit by means of the second digital control signal. The second amplifier circuit, in addition, has a second signal output.

The antenna amplifier has a summator connected to the first signal output and the second signal output. The summator is formed for the summation of signals at the first signal output and second signal output and to output a sum signal at a sum signal output.

The antenna amplifier has a digital gain controller with a digital command signal input for receiving a digital command signal from a receiver, preferably transmitted over a cable. The gain controller has a digital control signal output for outputting the first digital control signal and the second digital control signal.

The object of the invention is furthermore to provide a receiving system for reception. Accordingly, a receiving system with a receiver and an above-explained antenna amplifier are provided.

The receiver is set up for detecting overdriving of at least one of the amplifier circuits in the antenna amplifier based on the sum signal. The receiver can have a number of receiving circuits (tuners), which are connected to a digital signal processor for detecting overdriving.

The receiver is set up for transmitting the digital command signal to the antenna amplifier. The receiver by means of the transmitted command signal, initiates a reduction of the amplification in the antenna amplifier by the first digital control signal or the second digital control signal.

The object of the invention is furthermore to provide a method for operating a receiving system. Accordingly, a method is provided for operating a receiving system with a receiver and with an antenna amplifier having a number of amplifier circuits with analog automatic gain control, and a summator for summing output signals of the amplifier circuits to output a sum signal.

Depending on the digital command signal, the digital gain controller acts by means of a digital control signal on the analog automatic gain control of the amplifier circuit for setting the amplification. In this case, attenuation of an attenuator of the analog automatic gain control is preferably increased.

The invention furthermore has as its object to provide a use of a receiving system in a motor vehicle. Accordingly, a use of a receiving system in a motor vehicle is provided with a cable for the preferably simultaneous transmission of a sum signal to a receiver and a digital command signal. The sum signal is formed from several summated antenna signals amplified by antenna amplifiers. The digital command signal is transmitted from the receiver to the antenna amplifier. The digital command signal is used to set an amplification of an antenna signal in the case of overdriving.

The embodiments described hereinafter refer to the antenna amplifier, as well as to the receiving system, the use, and the method. Process steps emerge in this case also from the functionality of the receiving system.

Each amplifier circuit can have its own automatic gain control (AGC), which functions independently. In addition, an actuator, such as, for example, an attenuator, of the amplifier circuit can be influenced by a digital command signal external with respect to the antenna amplifier.

At least one amplifier, for example, a differential amplifier, of the amplifier circuit can be set by the digital command signal into a power saving mode, whereby in the power saving mode the signal isolation between the signal paths of the antenna signals is increased.

According to an embodiment, it is provided that the sum signal output is connected to the digital command signal input. Both the sum signal output and the digital command signal input can be connected to a terminal of the antenna amplifier to connect a cable.

According to an embodiment, the first amplifier circuit can have a first analog automatic gain control (AGC). According to another embodiment, the second amplifier circuit can have a second analog automatic gain control. The first analog automatic gain control and the second analog automatic gain control can operate independently of one another.

In an embodiment, the digital gain controller is formed to act on the first analog automatic gain control by the first digital control signal. In another embodiment, the digital gain controller is formed to act on the second analog automatic gain control by means of the second digital control signal. The first and/or second analog automatic gain control are formed for reducing the amplification using the first digital control signal or the second digital control signal. To reduce the amplification, the amplification is controlled preferably to an amplification value below a control range of the analog automatic gain control.

In a first embodiment, it is provided that the first digital control signal can be formed to set the first analog automatic gain control to a first fixed value and/or to deactivate the first analog automatic gain control.

In a second embodiment, it is provided that the second digital control signal can be formed to set the second analog automatic gain control to a second fixed value and/or to deactivate the second analog automatic gain control.

In an embodiment, the first amplifier circuit can have a first settable attenuator for attenuating a first signal to be amplified at the first signal input. In another advantageous embodiment variant, the second amplifier circuit has a second settable attenuator for attenuating a second signal to be amplified at the second signal input. An attenuator is preferably a PIN diode connected in the signal level, the attenuation by the PIN diode depending on current flow through the PIN diode.

According to an embodiment, it is possible to change a first attenuation of the first attenuator by means of the first analog automatic gain control and the first digital control signal. According to another embodiment, it is possible to change a second attenuation of the second attenuator by means of the second analog automatic gain control and the second digital control signal.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

An antenna cable as a connection to the tuner of the car radio or the head unit is needed for each antenna amplifier, which is located in a motor vehicle usually very close to the associated antenna. The number of said cables can reach the value of four in the antennas currently present in the motor vehicle just for the AM/FM/DAB range. Said cables are cost-intensive both with respect to material and effort for installation in the motor vehicle.

Figure 1:
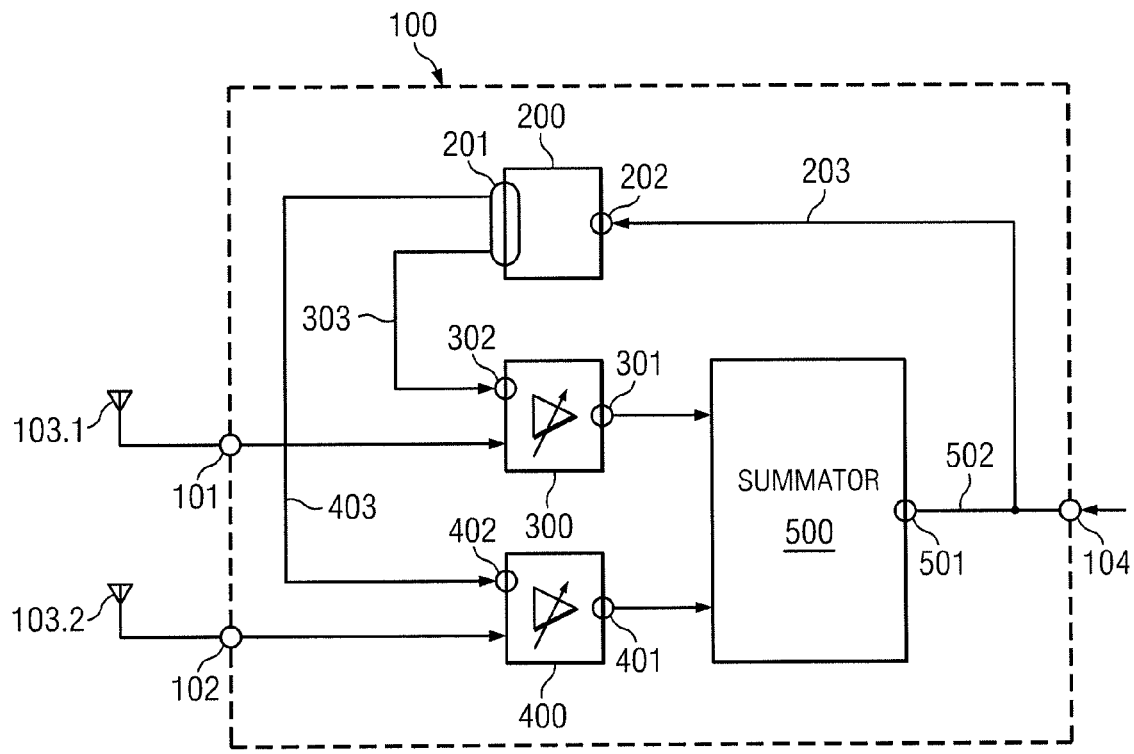
FIG. 1 shows a schematic illustration of an exemplary embodiment of an antenna amplifier.

FIG. 1 shows an antenna amplifier 100 of the invention with a first signal input 101, to which a first antenna 103.1 is connected, and a second signal input 102, to which a second antenna 103.2 is connected. A greater number of signal inputs for other antennas is possible in this case. It is also possible to integrate antennas together with antenna amplifier 100 in a housing or on a semiconductor chip and/or to provide externally connected antennas. Antennas 103.1 and 103.2 are each connected to the associated signal inputs 101 and 102 of antenna amplifier 100.

First signal input 101 is connected to a first amplifier circuit 300, which has both a first digital control signal input 302 for receiving a first digital control signal 303 and a first signal output 301 for signal output. First digital control signal 303 is formed to set an amplification of first amplifier circuit 300.

Similarly, second signal input 102 is connected to a second amplifier circuit 400, which [has] a second digital control signal input 402 for receiving a second digital control signal 403, by which an amplification of second amplifier circuit 400 is set, and a second signal output 401 for signal output.

First signal output 301 of first amplifier circuit 300 and second signal output 401 of second amplifier circuit 400 are connected to a summator 500, which has a sum signal output 501 to output a sum signal 502. Summator 500 is formed, for example, as a crossover filter and/or as a passive adder. Sum signal output 501 is connected to a signal output 104 for outputting.

Signal output 104 at the same time functions as digital command signal input 104 of antenna amplifier 100, so that it is also connected to a digital command signal input 202 of a digital gain controller 200. Digital command signal input 202 is formed to receive a digital command signal 203. Digital gain controller 200 is used to detect first digital control signal 303 and second digital control signal 403 from digital command signal 203. The amplification of first amplifier circuit 300 and the amplification of second amplifier circuit 400 are therefore controlled by means of digital command signal 203.

Figure 2:
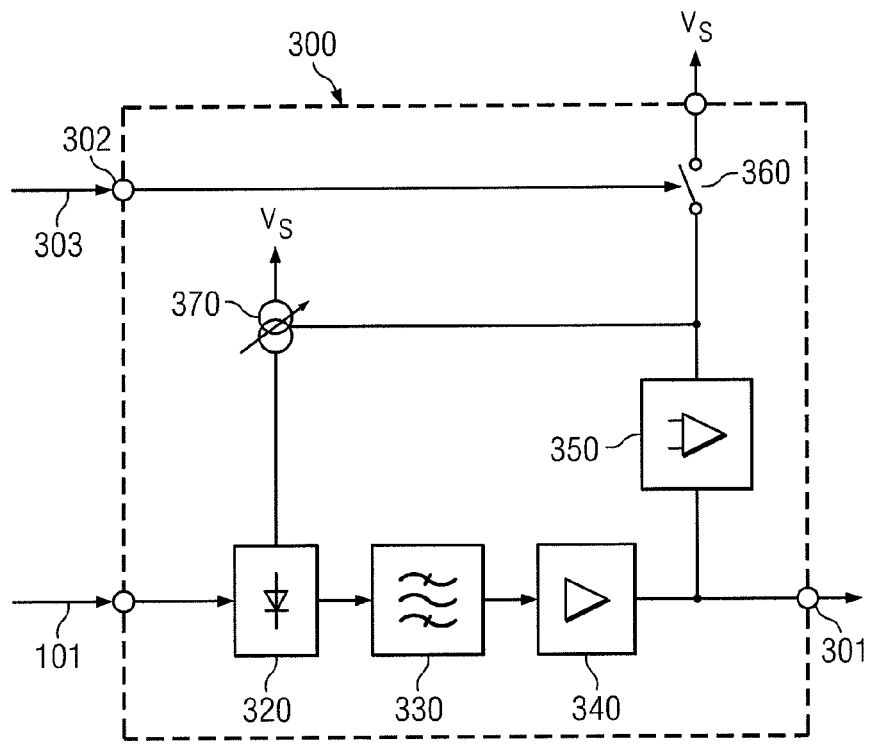
FIG. 2 shows an exemplary embodiment of an amplifier circuit of an antenna amplifier.

FIG. 2 shows an exemplary embodiment of a first amplifier circuit 300, as can be used by way of example in an antenna amplifier 100 according to FIG. 1. This possible embodiment of amplifier circuit 300 has an attenuator 320, a filter 330, an amplifier element 340, first signal output 301, a detection element 350 with an RF level detector, and a comparator, a switch 360 with at least two possible switch positions, and a controllable current source 370. Attenuator 320 is an attenuation circuit or preferably a component formed for attenuating the input signal, such as, for example, a PIN diode. Filter 330 is preferably a bandpass filter for selecting a channel or several neighboring channels. Amplifier element 340 is preferably an HF amplifier circuit.

Attenuator 320 is connected to first signal input 101, filter 330, and controllable current source 370. Filter 330 is connected to amplifier element 340, which is connected both to first signal output 301 and to detection element 350. Detection element 350 is connected to switch 360 and controllable current source 370. In a first switch position, only detection element 350 is connected to controllable current source 370. In a second switch position of switch 360, the supply voltage Vs is connected directly to controllable current source 370. In this case, the switch position is controlled by digital control signal 303 at control input 302.

Attenuator 320 with controllable current source 370, amplifier element 340, and detection element 350 together form an analog automatic gain control (AGC). Filter 330 is also arranged within the loop of the analog automatic gain control. The filter formed as a bandpass filter can also be arranged in another position within amplifier circuit 300, for example, upstream of attenuator 320. Second amplifier circuit 400 in FIG. 1. is advantageously formed by analogy with the circuit shown in FIG. 2.

A detection voltage (rectified HF signal), which corresponds to the amplitude and controls current source 370, is generated by detection element 350. If the detection voltage increases, the current of current source 370 and thereby the current through attenuator 320 increase, so that the attenuation of the signal through attenuator 320 also increases. A reduction of the amplitude of the signal selected by filter 330, the other way around, leads to a reduction of the attenuation. If switch 360 is controlled by digital control signal 303 at digital control input 302 in the closed switch position, the analog control input of current source 370 is connected to the voltage Vs, so that the current of current source 370 is controlled to a maximum value or a current value with a higher attenuation than the automatic gain control.

Advantageously, a first filter 320 for filtering first frequency components is arranged in first amplifier circuit 300 and a second filter for filtering second frequency components in second amplifier circuit 400 of FIG. 1. As a result, different channels can be specifically amplified by a different amplifier circuit 300/400, etc. Thus, for example, an amplifier circuit can be selectively adapted to a short wave signal, another to a medium wave signal, and another to a VHF signal or DAB signal and assigned specifically to these channels by means of the particular filter (330).

Figure 3:
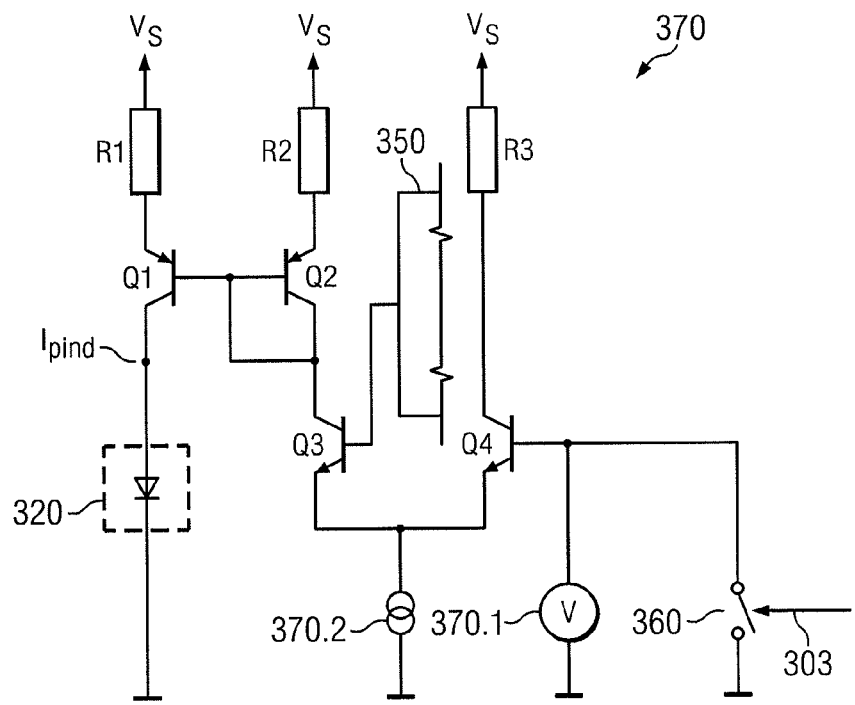
FIG. 3 shows an exemplary embodiment with a current source of an amplifier circuit.

FIG. 3 shows a first exemplary embodiment of a circuit with a controllable current source 370 and a PIN diode 320 as an attenuator. In this case, the circuit has the following components: a first resistor R1, a second resistor R2, and a third resistor R3, each of which is connected to a supply voltage Vs, a first PNP transistor Q1, a second PNP transistor Q2, which together with resistors R1 and R2 are connected as a current mirror, and a first NPN transistor Q3 and a second Q4 NPN transistor, whose emitters are connected to a constant current source 370.2.

Furthermore, the circuit has a switch 360 with two possible switch positions and a reference voltage source 370.1, which are connected to the base of transistor Q4. The base of transistor Q3 is connected to a detection element 350. PIN diode 320 is controlled by the current Ipind. The analog output signal of detection element 350 changes the current through transistor Q3 and because of the current mirror the current Ipind. Switch 360 can be closed by digital control signal 303, so that the base of transistor Q4 is connected to ground so that transistor Q4 blocks. The current of constant current source 370.2 now flows exclusively through transistor Q3 and the current Ipind through PIN diode 320 is accordingly high, so that the attenuation of PIN diode 320 in this switch position of switch 360 is controlled to a maximum value independent of the output signal of detection element 350.

Figure 4:
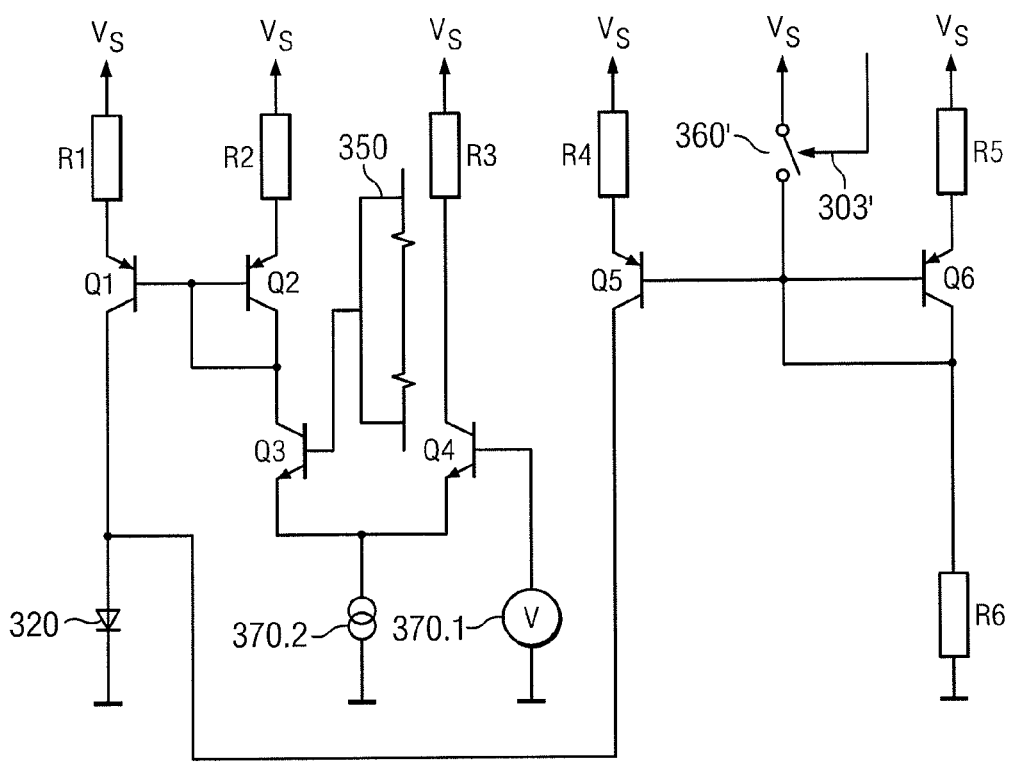
FIG. 4 shows another exemplary embodiment with a current source of an amplifier circuit.

FIG. 4 shows another exemplary embodiment of a circuit with a PIN diode 320. In contrast to the exemplary embodiment of FIG. 3, switch 360' is connected not to the base of transistor Q4 but to the bases of two second PNP transistors Q5 and Q6 connected as a current mirror, which with resistors R4 and R5 form another current mirror, which mirrors the current through resistor R6 in a current through PIN diode 320. When switch 360' in a first switch position because of digital control signal 303' connects the bases of transistors Q5 and Q6 with the voltage Vs, both transistors Q5 and Q6 block, so that no current reaches PIN diode 320 through transistor Q5. Its attenuation in this switch position is determined solely by the action, of the analog automatic gain control. In the other switch position, in contrast, transistors Q5 and Q6 conduct, so that the current through transistor Q5 also flows through PIN diode 320, so that the attenuation of PIN diode 320 in this switch position of switch 360' is controlled to a maximum value substantially independent of the output signal of detection element 350.

Figure 5:
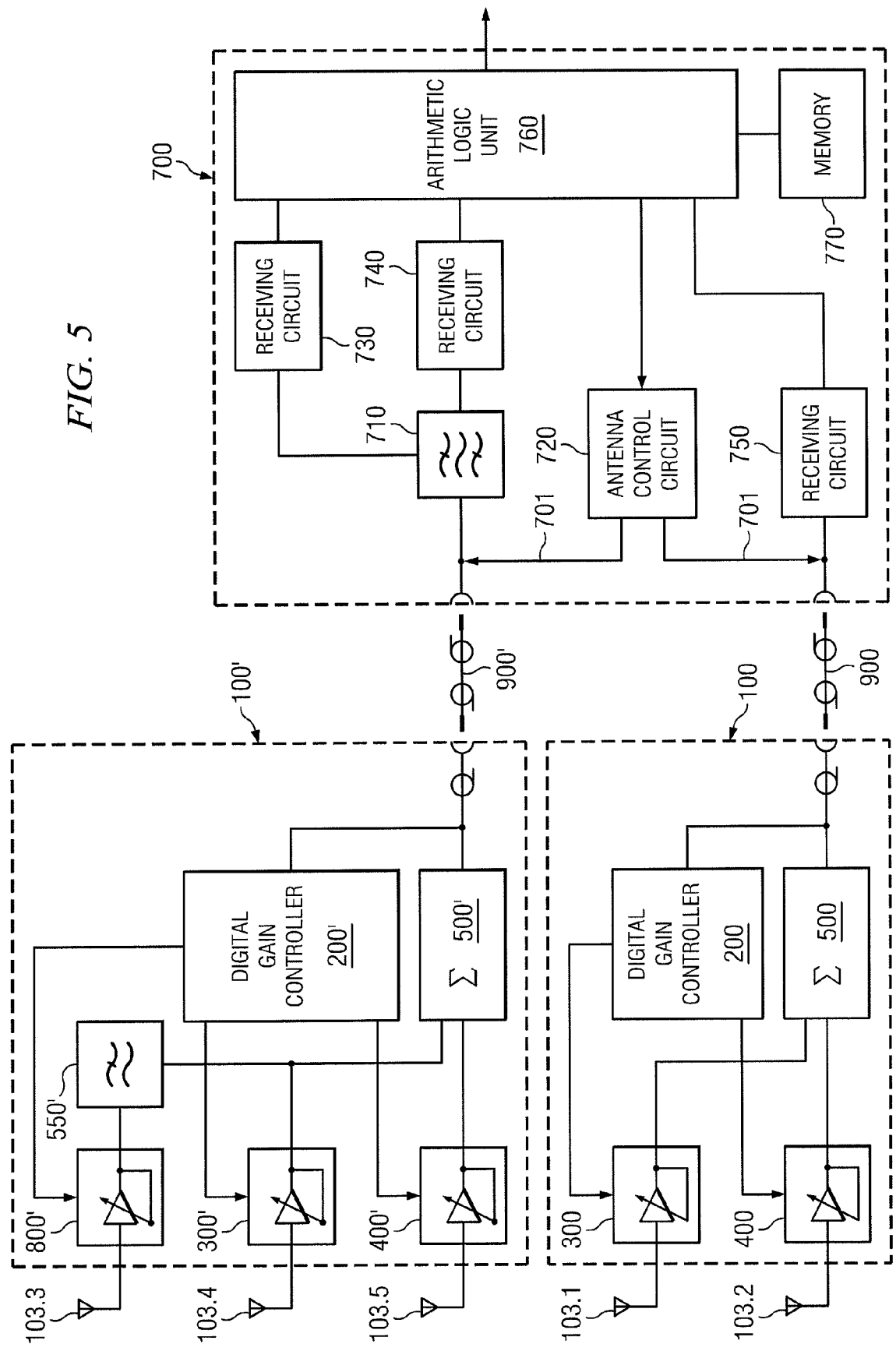
FIG. 5 shows an exemplary embodiment of a receiving system.

FIG. 5 shows a schematic drawing of a receiving system. The receiving system includes a receiver 700 and an aforementioned antenna amplifier 100. Receiver 700 is laid out for detecting overdriving of an analog automatic gain in antenna amplifier 100 based on a sum signal. To this end, the sum signal reaches receiving circuit 750 (tuner) from summator 500 over cable 900. An arithmetic logic unit 760, which is formed, for example, as a processor, detects overdriving by evaluating the output signal of receiving circuit 750.

Receiver 700 has an antenna control circuit 720, which is connected to arithmetic logic unit 760. The receiver is formed for transmitting a digital command signal 701 from receiver 700 to antenna amplifier 100 by means of antenna control circuit 720 to initiate a reduction of the analog automatic amplification in antenna amplifier 100. To this end, antenna control circuit 720 transmits digital control signal 701 with an address for addressing first amplifier circuit 300 or second amplifier circuit 400 to digital gain controller 200 over cable 900.

FIG. 5 shows another antenna amplifier 100', which has three amplifier circuits 300', 400', and 800' each with analog automatic gain control and a digital control input. Three antennas 103.3, 103.4, and 103.5 can be connected to amplifier circuits 300', 400', and 800'. The additional antenna amplifier 100' has a passive adder 500' as a summator, whose output is connected via another cable 900' to receiver 700. In combination with a passive adder 500', the other antenna amplifier 100' moreover has a crossover filter 550' as a summator which enables the summation of signals in different frequency bands. To this end, accordingly, another crossover filter 710 is provided in receiver 700, which divides the signals of two frequency bands again into two receiving circuits 730 and 740.

In the exemplary embodiment of FIG. 5, the digital command signal and the sum signal for the AM/FM/DAB range of a car radio are transmitted in precisely one cable 900, 900'. Thereby, the advantage is achieved of limiting the number of cables 900, 900' from antenna amplifier 100, 100' to receiver 700 to one, as a result of which both the material costs and the amount of work for installing cable 900, 900' are significantly reduced. Preferably, only a single cable 900, 900' is required.

The invention is not limited to the shown embodiment variants in FIGS. 1 through 5. For example, it is possible to use field-effect transistors instead of bipolar transistors. It is also possible to arrange filter 330 in the signal path upstream of an analog automatic gain control. The analog sum signals and the digital command signals can also be transmitted over two separate cores of a two-core cable. The command signals can also be transmitted over a standardized bus system of a motor vehicle. In addition, it would be possible to transmit the digital command signal wirelessly to the receiving circuit. The functionality of the receiving system according to FIG. 5 can be used with particular advantage in a motor vehicle.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An antenna amplifier, comprising:
a first amplifier circuit configured to receive a first signal from a first antenna, the first amplifier circuit having a first analog automatic gain control and a first signal output, the first analog automatic gain control configured to set a first amplification of the first signal in response to receiving a first digital control signal;
a second amplifier circuit configured to receive a second signal from a second antenna, the second amplifier circuit having a second analog automatic gain control and a second signal output, the second analog automatic gain control configured to set a second amplification of the second signal in response to receiving a second digital control signal;
a summator connectable to the first signal output of the first amplifier circuit and the second signal output of the second amplifier circuit, the summator having a sum signal output configured to output to a receiver a sum signal representing a sum of the first signal output and the second signal output, wherein the sum signal is transmitted by a single cable; and
a digital gain controller configured to receive a digital command signal generated by the receiver in response to determining, based on the sum signal, overdriving of the first amplifier circuit or the second amplifier circuit, wherein the digital command signal is transmitted by the single cable, the digital gain controller configured to control the setting of a selected one of the first amplification and the second amplification by outputting the first digital control signal to the first amplifier circuit or the second digital control signal to the second amplifier circuit.

2. The antenna amplifier according to claim 1, wherein the first digital control signal output from the digital gain controller is configured to act on the first analog automatic gain control the second digital control signal output from the digital gain controller is configured to act on the second analog automatic gain control.

3. The antenna amplifier according to claim 1, wherein the first digital control signal is configured to set the first analog automatic gain control to a first fixed value.

4. The antenna amplifier according to claim 1, wherein the first digital control signal is configured to deactivate the first analog automatic gain control.

5. The antenna amplifier according to claim 1, wherein the second digital control signal is configured to set the second analog automatic gain control to a second fixed value.

6. The antenna amplifier according to claim 1, wherein the second digital control signal is configured to deactivate the second analog automatic gain control.

7. The antenna amplifier according to claim 1, wherein the first amplifier circuit has a first settable attenuator configured to attenuate the first signal from the first antenna, and the second amplifier circuit has a second settable attenuator configured to attenuate the second signal from the second antenna.

8. The antenna amplifier according to claim 7, wherein a first attenuation of the first settable attenuator is changeable by the first analog automatic gain control in response to receiving the first digital control signal.

9. The antenna amplifier according to claim 7, wherein a second attenuation of the second settable attenuator is changeable by the second analog automatic gain control in response to receiving the second digital control signal.

10. A system, comprising:
an antenna amplifier, comprising:
a first amplifier circuit configured to receive a first signal from a first antenna, the first amplifier circuit having a first signal output, the first amplifier circuit configured to set a first amplification of the first signal in response to receiving a first digital control signal;
a second amplifier circuit configured to receive a second signal from a second antenna, the second amplifier circuit having a second signal output, the second amplifier circuit configured to set a second amplification of the second signal in response to receiving a second digital control signal;
a summator connectable to the first signal output of the first amplifier circuit and the second signal output of the second amplifier circuit, the summator having a sum signal output configured to output a sum signal representing a sum of the first signal output and the second signal output; and
a digital gain controller configured to receive a digital command signal from the receiver, the digital gain controller comprising a digital control signal output configured to output, based on the received digital command signal, the first digital control signal to control the setting of the first amplification or the second digital control signal to control the setting of the second amplification; and
a receiver configured to:
receive the sum signal;
generate the digital command signal in response to determining, based on the received sum signal, overdriving of the first amplifier circuit or the second amplifier circuit; and
transmit the digital command signal to the digital gain controller, wherein the sum signal and the digital command signal are transmitted by a single cable.

11. The system of claim 10, wherein the first amplifier circuit comprises a first analog automatic gain control and the second amplifier circuit comprises a second analog automatic gain control; and
wherein the first digital control signal output from the digital gain controller is configured to act on the first analog automatic gain control and the second digital control signal output from the digital gain controller is configured to act on the second analog automatic gain control.

12. The system of claim 10, wherein the digital command signal includes an address of the first amplifier circuit or the second amplifier circuit, wherein the digital gain controller selects the first amplifier circuit or the second amplifier circuit for amplification based on the address.

13. A method, comprising:
receiving a first signal from a first antenna;
receiving a second signal from a second antenna;
setting a first amplification of the first signal in response to receiving a first digital control signal;
setting a second amplification of the second signal in response to receiving a second digital control signal;
amplifying the first signal at the first amplification to produce a first amplified signal;
amplifying the second signal at the second amplification to produce a second amplified signal;
summing the first amplified signal and the second amplified signal to produce a sum signal;

outputting the sum signal to a receiver, the receiver operable to generate a digital command signal in response to determining, based on the sum signal, overdriving of the first amplifier circuit or the second amplifier circuit, wherein the sum signal and the digital command signal are transmitted by a single cable;

receiving, at a digital gain controller, the digital command signal generated by the receiver; and outputting, from the digital gain controller, the first digital control signal to the first amplifier circuit and the second digital control signal to the second amplifier circuit.

14. The method of claim 13, wherein the first digital control signal is configured to set the first amplification by acting on a first analog automatic gain control and the second digital control signal is configured to set the second amplification by acting on a second analog automatic gain control.

15. The method of claim 13, further comprising:

initiating a reduction of one of the first amplification and the second amplification based on the digital command signal.

16. The method of claim 13, wherein the first digital control signal and the second digital control signal are operable to independently set the first amplification and the second amplification.

17. The method of claim 13, wherein the first amplification is adapted to a first channel and the second amplification is adapted to a second channel, wherein the first and second channels are different.

18. The method of claim 13, wherein the sum signal is output to the receiver by the single cable connected to the receiver and the digital command signal is received from the receiver by the single cable.

\* \* \* \* \*

UNITED STATES PATENT AND TRADEMARK OFFICE
CERTIFICATE OF CORRECTION

| | | |
|---|---|---|
| PATENT NO. | : 8,837,647 B2 | Page 1 of 1 |
| APPLICATION NO. | : 12/567349 | |
| DATED | : September 16, 2014 | |
| INVENTOR(S) | : Stephan Gerlach et al. | |

It is certified that error appears in the above-identified patent and that said Letters Patent is hereby corrected as shown below:

In the Claims

Col. 7, line 40, Claim 2, delete "gain control" and insert -- gain control and --, therefor.

Signed and Sealed this
Nineteenth Day of May, 2015

Michelle K. Lee
*Director of the United States Patent and Trademark Office*